(12) United States Patent
Jung et al.

(10) Patent No.: US 12,453,248 B2
(45) Date of Patent: Oct. 21, 2025

(54) DISPLAY DEVICE

(71) Applicant: Samsung Display Co., LTD., Yongin-si (KR)

(72) Inventors: Joo Hong Jung, Asan-si (KR); Jae Hong Park, Seongnam-si (KR); Dong Won Han, Seoul (KR)

(73) Assignee: Samsung Display Co., LTD., Yongin-Si (KR)

( * ) Notice: Subject to any disclaimer, the term of this patent is extended or adjusted under 35 U.S.C. 154(b) by 628 days.

(21) Appl. No.: 17/830,309

(22) Filed: Jun. 1, 2022

(65) Prior Publication Data

US 2023/0099550 A1 Mar. 30, 2023

(30) Foreign Application Priority Data

Sep. 27, 2021 (KR) ........................ 10-2021-0127034

(51) Int. Cl.
*H01L 27/32* (2006.01)
*H10K 50/844* (2023.01)
*H10K 59/122* (2023.01)
*H10K 59/88* (2023.01)

(52) U.S. Cl.
CPC ......... *H10K 59/122* (2023.02); *H10K 50/844* (2023.02); *H10K 59/88* (2023.02)

(58) Field of Classification Search
CPC .... H10K 59/122; H10K 50/844; H10K 59/88; H10K 59/873; H10K 59/123
See application file for complete search history.

(56) References Cited

U.S. PATENT DOCUMENTS

| | | | |
|---|---|---|---|
| 9,024,449 | B2 | 5/2015 | Okumoto et al. |
| 10,454,063 | B2 | 10/2019 | Chang et al. |
| 2003/0126454 | A1 | 7/2003 | Glew et al. |
| 2022/0020957 | A1* | 1/2022 | Choi ................. H10K 59/8731 |

FOREIGN PATENT DOCUMENTS

| | | |
|---|---|---|
| JP | 6704020 | 6/2020 |
| KR | 10-2004-0068606 | 7/2004 |
| KR | 10-2006-0019907 | 3/2006 |
| KR | 10-2016-0081106 | 7/2016 |
| KR | 10-2020-0036291 A | 4/2020 |
| KR | 10-2020-0039264 | 4/2020 |
| KR | 10-2021-0052876 A | 5/2021 |
| WO | 2012-176232 | 12/2012 |

* cited by examiner

*Primary Examiner* — Elmito Breval
(74) *Attorney, Agent, or Firm* — Innovation Counsel LLP

(57) ABSTRACT

A display device includes a substrate having a display area and a non-display area; a first transistor that is disposed on the substrate and that overlaps the display area; a first pixel defining layer disposed on the first transistor; a first emission layer disposed in the first pixel defining layer; a second pixel defining layer that is disposed on the substrate and that overlaps the non-display area; a second emission layer disposed in the second pixel defining layer; a second electrode disposed on the first emission layer and the second emission layer; and an encapsulation organic layer disposed on the second electrode, wherein the encapsulation organic layer overlaps the first pixel defining layer and the second pixel defining layer, and an end of the encapsulation organic layer is disposed inside the second pixel defining layer.

19 Claims, 9 Drawing Sheets

DISPLAY DEVICE

CROSS-REFERENCE TO RELATED APPLICATION

This application claims priority from and the benefit of Korean Patent Application No. 10-2021-0127034, filed on Sep. 27, 2021, which is hereby incorporated by reference for all purposes as if fully set forth herein.

BACKGROUND

Field

Embodiments of the invention relate generally to a display device, and more particularly, to a display device in which an encapsulation organic layer is stably formed.

Discussion of the Background

A light emitting display device has advantages of having excellent luminance, driving voltage, and response speed characteristics, and being able to be multicolored, so that it is being applied to various products such as smartphones, monitors, and TVs.

The light emitting display device includes a display panel that includes a light emitting element. In the light emitting element, a cathode electrode and an anode electrode are disposed around a light emitting layer, and when a voltage is applied to these electrodes, light is emitted from the light emitting layer connected to these electrodes.

The above information disclosed in this Background section is only for enhancement of understanding of the background of the invention, and therefore it may contain information that does not form the prior art that is already known in this country to a person of ordinary skill in the art.

The above information disclosed in this Background section is only for understanding of the background of the inventive concepts, and, therefore, it may contain information that does not constitute prior art.

SUMMARY

Inventive concepts consistent with one or more embodiments provide a display device in which an encapsulation organic layer is stably formed by changing a shape of a pixel defining layer.

Additional features of the inventive concepts will be set forth in the description that follows, and in part will be apparent from the description, or may be learned by practice of the inventive concepts.

An embodiment provides a display device including: a substrate having a display area and a non-display area; a first transistor that is disposed on the substrate and that overlaps the display area; a first pixel defining layer disposed on the first transistor; a first emission layer disposed in the first pixel defining layer; a second pixel defining layer that is disposed on the substrate and that overlaps the non-display area; a second emission layer disposed in the second pixel defining layer; a second electrode disposed on the first emission layer and the second emission layer; and an encapsulation organic layer disposed on the second electrode, wherein the encapsulation organic layer overlaps the first pixel defining layer and the second pixel defining layer, and an end of the encapsulation organic layer is disposed inside the second pixel defining layer.

A first angle between one side surface of the first pixel defining layer and an upper surface of the substrate and a second angle between one side surface of the second pixel defining layer and the upper surface of the substrate may be different.

The first angle may be smaller than the second angle.

The first angle may be about 25 degrees to about 30 degrees.

The second angle may be about 45 degrees to about 50 degrees.

The first pixel defining layer may include a first side surface, a first lower surface, and a first upper surface; and the second pixel defining layer may include a second side surface, a second lower surface, and a second upper surface.

A first area ratio of the first upper surface to the first lower surface may be different from a second area ratio of the second upper surface to the second lower surface.

The first area ratio may be smaller than the second area ratio.

A distance between an end of the first upper surface and an end of the first lower surface may be a first distance, and a distance between an end of the second upper surface and an end of the second lower surface may be a second distance.

The first distance and the second distance may be different.

The first distance may be larger than the second distance.

The display device may further include a dam overlapping the non-display area, and the encapsulation organic layer may be spaced apart from the dam.

The display device may further include a first encapsulation inorganic layer and a second encapsulating inorganic layer that are disposed on respective surfaces of the encapsulation organic layer, respectively, and the first encapsulating inorganic layer and the second encapsulating inorganic layer may be disposed on the dam.

The second emission layer may not be electrically connected to the transistor.

Another embodiment provides a display device including: a substrate having a display area and a non-display area; a first transistor that is disposed on the substrate and that overlaps the display area; a first pixel defining layer disposed on the transistor; a first emission layer disposed in the first pixel defining layer; a dummy transistor disposed on the substrate and that overlaps the non-display area; a second pixel defining layer disposed on the dummy transistor; a second emission layer disposed in the second pixel defining layer; and a second electrode disposed on the first emission layer and the second emission layer, wherein an angle between a first side surface of the first pixel defining layer and an upper surface of the substrate is smaller than an angle between a second side surface of the second pixel defining layer and the upper surface of the substrate.

The display device may further include an encapsulation organic layer disposed on the second electrode, and an end of the encapsulation organic layer may be disposed in an opening of the second pixel defining layer.

The angle between the first side surface of the first pixel defining layer and the upper surface of the substrate may be about 25 degrees to about 30 degrees, and the angle between the second side surface of the second pixel defining layer and the upper surface of the substrate may be about 45 degrees to about 50 degrees.

An area ratio of a first upper surface to a first lower surface of the first pixel defining layer may be smaller than an area ratio of a second upper surface to a second lower surface of the second pixel defining layer.

A distance between an end of the first upper surface and an end of the first lower surface of the first pixel defining layer may be longer than a distance between an end of the second upper surface and an end of the second lower surface of the second pixel defining layer.

The display device may further include a dam disposed in the non-display area, and the encapsulation organic layer may not overlap the dam.

According to the embodiments, it is possible to provide a display device in which an encapsulation organic layer is stably formed by changing a shape of a pixel defining layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
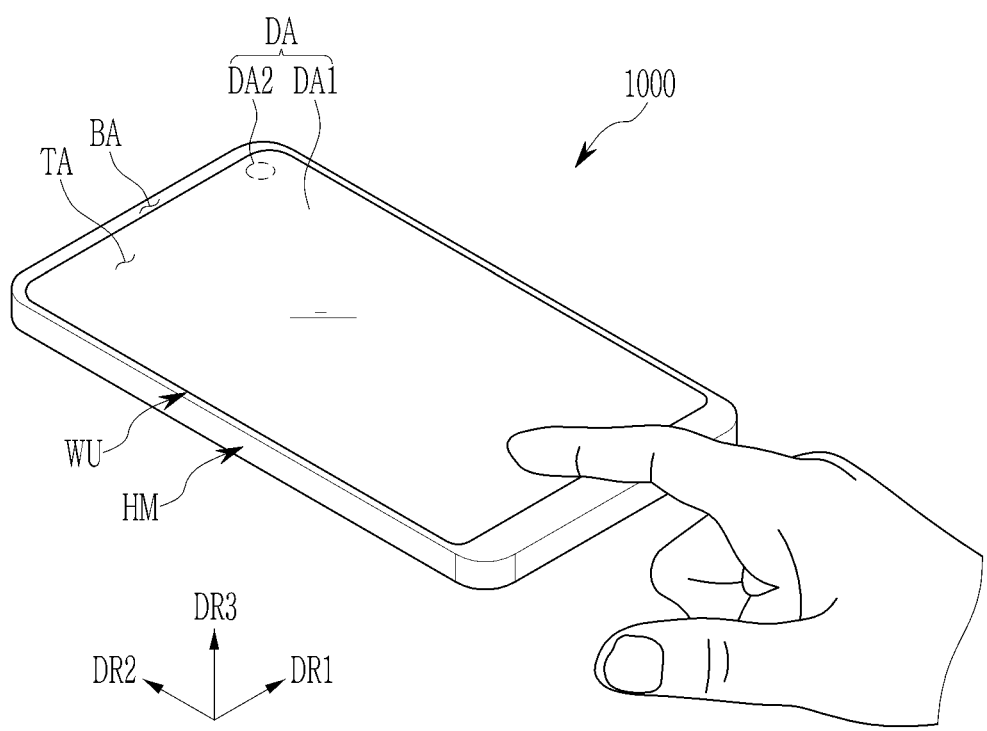
FIG. 1 illustrates a schematic perspective view of a use state of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
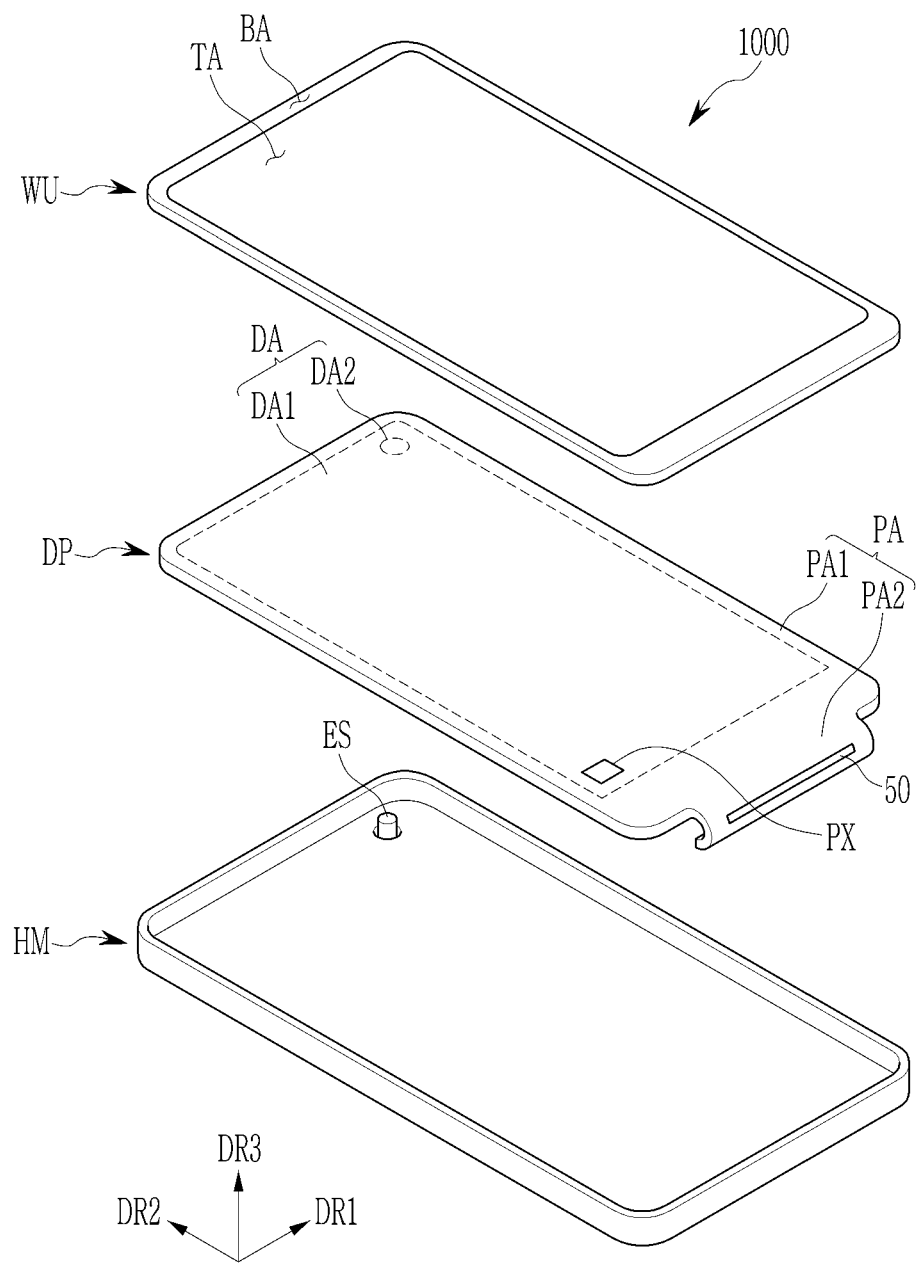
FIG. 2 illustrates an exploded perspective view of a display device according to an embodiment.
Figure 3:
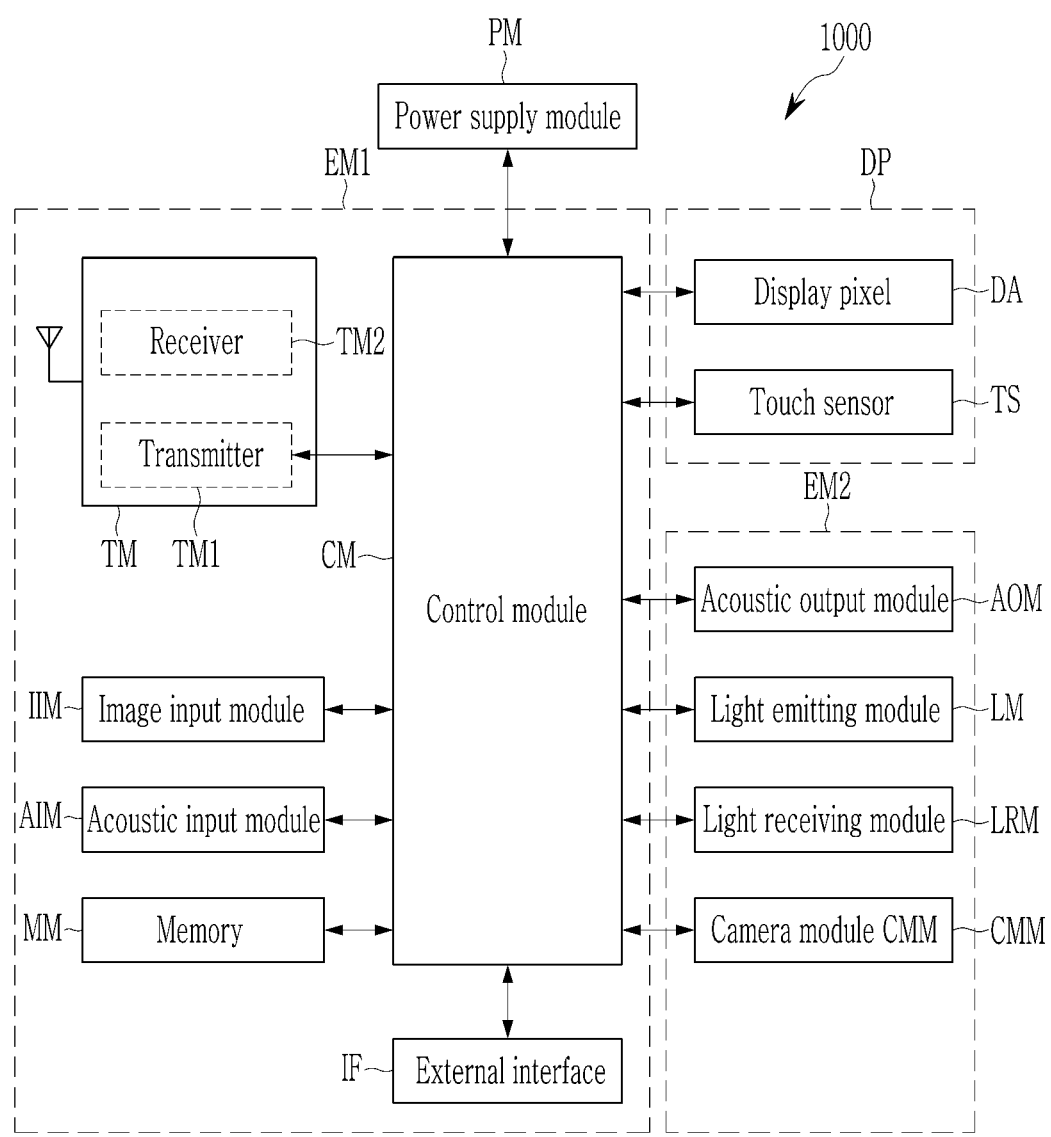
FIG. 3 illustrates a block diagram of a display device according to an embodiment.

Hereinafter, a schematic structure of a display device will be described with reference to FIG. 1 to FIG. 3. FIG. 1 illustrates a schematic perspective view of a use state of a display device according to an embodiment that is constructed according to principles of the invention, FIG. 2 illustrates an exploded perspective view of a display device according to an embodiment, and FIG. 3 illustrates a block diagram of a display device according to an embodiment.

Referring to FIG. 1, a display device 1000 according to an embodiment is a device for displaying a moving image or a still image, and may be used as a display screen of a portable electronic device such as a mobile phone, a smart phone, a tablet personal computer (PC), a mobile communication terminal, an electronic note, an electronic book, a portable multimedia player (PMP), a navigation device, and an ultra mobile PC (UMPC), and may be used as display screens of various products such as a television set, a laptop computer, a monitor, a billboard, and an Internet of things (IOT). In addition, the display device 1000 according to the embodiment may be used in a wearable device such as a smart watch, a watch phone, a glasses display, and a head mounted display (HMD). In addition, the display device 1000 according to the embodiment may be used as an instrument panel of a vehicle, a center information display (CID) disposed on a center fascia or dashboard of a vehicle, a room mirror display that replaces a side mirror of a vehicle, and a display disposed on the back of a front seat for entertainment for a rear seat of a vehicle. For better comprehension and ease of description, FIG. 1 illustrates a case in which that the display device 1000 is used for a smart phone.

The display device 1000 may display an image toward a third direction DR3 on a display surface parallel to each of a first direction DR1 and a second direction DR2. A display surface on which an image is displayed may correspond to a front surface of the display device 1000, and may correspond to a front surface of a cover window WU. An image may include a static image as well as a dynamic image.

In the embodiment described herein, a front (or top) surface and a rear (or bottom) surface of each member are defined based on a direction in which an image is displayed. The front and rear surfaces may be opposite to each other in the third direction DR3, and a normal direction of each of the front and rear surfaces may be parallel to the third direction DR3. A separation distance in the third direction DR3 between the front and rear surfaces may correspond to a thickness of a display panel in the third direction DR3.

The display device 1000 according to the embodiment may detect a user's input (see a hand of FIG. 1) applied from the outside. The user's input may include various types of external inputs such as a part of the user's body, light, heat, or pressure. In the embodiment, the user's input is shown to be the user's hand applied to the front surface. However, the invention is not limited thereto. The user's input may be variously provided, and the display device 1000 may sense the user's input applied to the lateral or rear surface of the display device 1000 according to the structure of the display device 1000.

Referring to FIG. 1 and FIG. 2, the display device 1000 may include a cover window WU, a housing HM, a display panel DP, and an optical element ES. In the embodiment, the cover window WU and the housing HM may be combined to form an appearance of the display device 1000.

The cover window WU may include an insulating panel. For example, the cover window WU may be made of glass, plastic, or a combination thereof.

A front surface of the cover window WU may define the front surface of the display device 1000. A transmission area TA may be an optically transparent area. For example, the transmission area TA may be an area having visible ray transmittance of about 90% or more.

A blocking area BA may define a shape of the transmission area TA. The blocking area BA may be adjacent to the transmission area TA, and may surround the transmission area TA. The blocking area BA may be an area having relatively low light transmittance compared with the transmission area TA. The blocking area BA may include an opaque material that blocks light. The blocking area BA may have a predetermined color. The blocking area BA may be defined by a bezel layer provided separately from a transparent substrate defining the transmission area TA, or may be defined by an ink layer formed by being inserted into or coloring the transparent substrate.

The display panel DP may include a display panel DP for displaying an image and a driver 50. The display panel DP may include a front surface that includes a display area DA and a non-display area PA. The display area DA may be an area in which a pixel operates to emit light according to an electrical signal.

In the embodiment, the display area DA may be an area that includes a pixel and in which an image is displayed, and may be an area in which a touch sensor is disposed at an upper side of the pixel in the third direction DR3 to sense an external input.

The transmission area TA of the cover window WU may at least partially overlap the display area DA of the display panel DP. For example, the transmission area TA may overlap the front surface of the display area DA, or may overlap at least a portion of the display area DA. Accordingly, a user may view an image through the transmission area TA, or may provide an external input based on the image. However, the embodiments described herein are not limited thereto. For example, the display area DA may be divided into an area in which an image is displayed and an area in which an external input is sensed.

The non-display area PA of the display panel DP may at least partially overlap the blocking area BA of the cover window WU. The non-display area PA may be an area covered by the blocking area BA. The non-display area PA may be adjacent to the display area DA, and may surround the display area DA. No image is displayed in the non-display area PA, and a driving circuit or driving wire for driving the display area DA may be disposed therein. The non-display area PA may include a first peripheral area PA1 in which the display area DA is disposed at an outer side thereof, and a second peripheral area PA2 including the driver 50, a connection wire, and a bending area. In the embodiment of FIG. 2, the first peripheral area PA1 is disposed at three sides of the display area DA, and the second peripheral area PA2 is disposed on the other side of the display area DA.

In the embodiment, the display panel DP may be assembled in a flat state in which the display area DA and the non-display area PA are directed to the cover window WU. However, the embodiments described herein are not limited thereto. A portion of the non-display area PA of the display panel DP may be bent. In this case, a portion of the non-display area PA faces the rear surface of the display device 1000, so that the blocking area BA shown on the front surface of the display device 1000 may be reduced, and as shown in FIG. 2, the second peripheral area PA2 is bent, so that it may be assembled after disposing it on the rear surface of the display area DA.

The display area DA may be largely divided into a first display area DA1 and a second display area DA2 (hereinafter also referred to as a component area), and in some embodiments, the second display area DA2 may include a light transmitting area and may also additionally include a pixel that displays an image. The second display area DA2 may include the light transmitting area to have relatively high light transmittance compared with the first display area DA1. In addition, the second display area DA2 may have a relatively smaller area than the first display area DA1. The second display area DA2 may at least partially overlap an optical element ES such as a camera or an optical sensor. FIG. 1 and FIG. 2 illustrate that the second display area DA2 is provided in a circle shape at an upper right side of the display device 1000, but the embodiments described herein are not limited thereto. The second display area DA2 may be provided in various numbers and shapes according to the number and shape of the optical elements ES.

The first display area DA1 may be adjacent to the second display area DA2. In the embodiment, the first display area DA1 may entirely surround the second display area DA2. However, the embodiments described herein are not limited thereto. The first display area DA1 may partially surround the second display area DA2.

The driver 50 may be mounted on the second peripheral area PA2, mounted on the bending part, or disposed at one of both sides of the bending part. The driver 50 may be provided in a form of a chip.

The driver 50 may be electrically connected to the display area DA to transmit an electrical signal to the display area DA. For example, the driver 50 may provide data signals to pixels PX disposed in the display area DA. Alternatively, the driver 50 may include a touch driving circuit, and may be electrically connected to the touch sensor TS disposed in the display area DA. The driver 50 may include various circuits in addition to the above-described circuits, or may be designed to provide various electrical signals to the display area DA.

A pad part may be disposed at an end of the second peripheral area PA2, and the display device 1000 may be electrically connected to a flexible printed circuit board (FPCB) including a driving chip by the pad part. Here, the driving chip disposed on the flexible printed circuit board may include various driving circuits for driving the display device 1000 or connectors for supplying power. In some embodiments, instead of the flexible printed circuit board, a rigid printed circuit board (PCB) may be used.

The optical element ES may be disposed under the display panel DP. The optical element ES may receive an external input transmitted through the second display area DA2, or may output a signal through the second display area DA2. In the embodiment, the second display area DA2 having relatively high transmittance is provided inside the display area DA, so that the optical element ES may be disposed to overlap the display area DA, and accordingly, the area (or size) of the blocking region BA may be reduced.

The housing HM may be combined with the cover window WU. The cover window WU may be disposed on the front surface of the housing HM. The housing HM may be combined with the cover window WU to provide a predetermined accommodation space. The display panel DP and the optical element ES may be accommodated in the predetermined accommodation space provided between the housing HM and the cover window WU.

The housing HM may include a material with relatively high rigidity. For example, the housing HM may include a plurality of frames and/or plates made of glass, plastic, or metal, or a combination thereof. The housing HM may stably protect the components of the display device 1000 accommodated in an inner space thereof from external impact.

Referring to FIG. 3 in addition to FIG. 1 and FIG. 2, the display device 1000 may include the display panel DP, a power supply module PM, a first electronic module EM1, and a second electronic module EM2. The display panel DP, the power supply module PM, the first electronic module EM1, and the second electronic module EM2 may be electrically connected to each other. FIG. 3 exemplarily illustrates the display pixel DA and the touch sensor TS disposed in the display area DA of the display panel DP.

The display panel DP may include the display area DA including a display pixel, and the touch sensor TS. The display panel DP may be visually recognized by a user from the outside by including the display pixel DA, which is a component that generates an image. In addition, the touch sensor TS may be disposed on the pixel, and may sense an external input applied from the outside. The touch sensor TS may detect an external input.

The power supply module PM may supply power required for an overall operation of the display device 1000. The power supply module PM may include a typical battery module.

The first electronic module EM1 and the second electronic module EM2 may include various functional modules for operating the display device 1000. The first electronic module EM1 may be directly mounted on a motherboard electrically connected to the display panel DP, or mounted on a separate substrate to be electrically connected to the motherboard through a connector.

The first electronic module EM1 may include a control module CM, a wireless communication module TM, an image input module IIM, an audio input module AIM, a memory MM, and an external interface IF. Some of the modules are not mounted on the motherboard, but may be electrically connected to the motherboard through the flexible printed circuit board connected thereto.

The control module CM may control the overall operation of the display device 1000. The control module CM may be a microprocessor. For example, the control module CM activates or deactivates the display panel DP. The control module CM may control other modules such as the image input module IIM or the audio input module AIM based on a touch signal received from the display panel DP.

The wireless communication module TM may transmit/receive a wireless signal with another terminal by using a Bluetooth or Wi-Fi line. The wireless communication module TM may transmit/receive a voice signal by using a general communication line. The wireless communication module TM includes a transmitter TM1 that modulates and transmits a signal to be transmitted, and a receiver TM2 that demodulates a received signal.

The image input module IIM may process an image signal to convert it into image data that may be displayed on the display panel DP. The audio input module AIM may receive an external audio signal inputted by a microphone in a recording mode, a voice recognition mode, etc. and convert it into electrical voice data.

The external interface IF may serve as an interface connected to an external charger, a wired/wireless data port, a card socket (for example, a memory card, a SIM/UIM card), and the like.

The second electronic module EM2 may include an audio output module AOM, a light emitting module LM, a light receiving module LRM, and a camera module CMM, and at least some of them are optical elements ES and may be disposed on the rear surface of the display area DA as shown in FIG. 1 and FIG. 2. The optical element ES may include the light emitting module LM, the light receiving module LRM, and the camera module CMM. In addition, the second electronic module EM2 may be directly mounted on the motherboard, mounted on a separate substrate to be electrically connected to the display panel DP through a connector, or electrically connected to the first electronic module EM1.

The audio output module AOM may convert audio data received from the wireless communication module TM or audio data stored in the memory MM to output it to the outside.

The light emitting module LM may generate and output light. The light emitting module LM may output infrared rays. For example, the light emitting module LM may include an LED element. For example, the light receiving module LRM may detect infrared rays. The light receiving module LRM may be activated when infrared rays of a predetermined level or more are sensed. The light receiving module LRM may include a CMOS sensor. After the infrared light generated by the light emitting module LM is outputted, it may be reflected by an external subject (for example, a user's finger or face), and then the reflected infrared light may be incident on the light receiving module LRM. The camera module CMM may capture an external image.

In the embodiment, the optical element ES may additionally include a light sensing sensor or a thermal sensing sensor. The optical element ES may sense an external object received through the front surface thereof, or may provide a sound signal such as a voice through the front surface to the outside. In addition, the optical element ES may include a plurality of constituent elements, and is not limited to any one embodiment.

Figure 4:
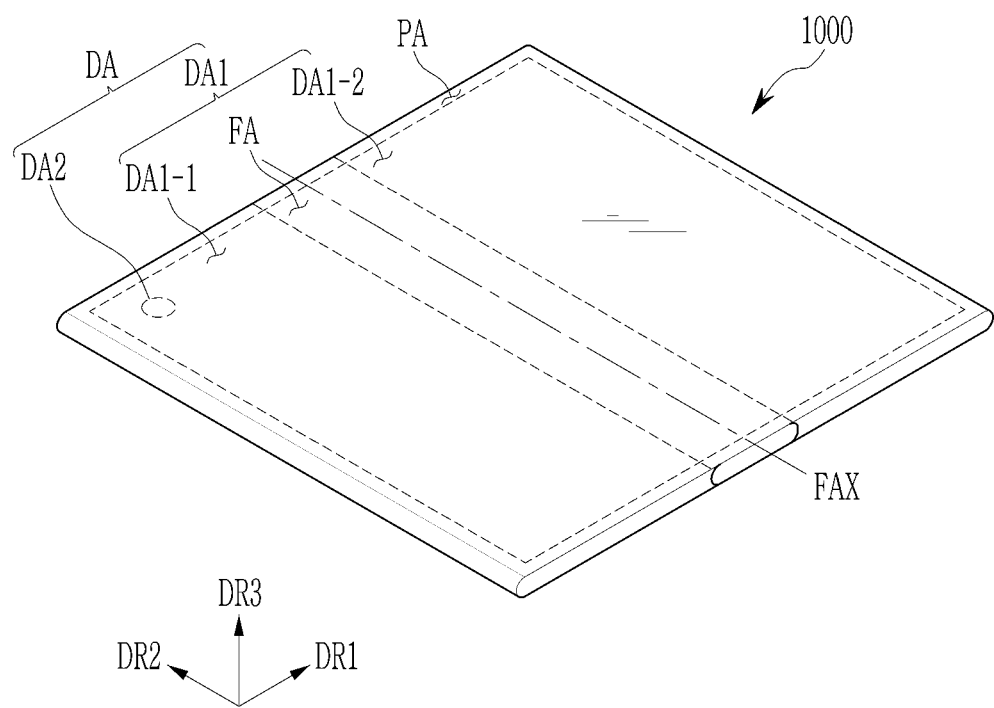
FIG. 4 illustrates a schematic perspective view of a display device according to another embodiment.

Hereinafter, a structure of a display device 1000 according to another embodiment will be described with reference to FIG. 4. FIG. 4 illustrates a schematic perspective view of a display device according to another embodiment.

FIG. 4 illustrates a foldable display device in which the display device 1000 is folded through a folding line FAX. In the foldable display device, the second display area DA2 (hereinafter also referred to as a component area) may be disposed at the edge of one side thereof as shown in FIG. 4. An optical element such as a camera or an optical sensor is disposed on the rear surface of the second display area DA2 of FIG. 4, and the light transmitting area is disposed in the second display area DA2.

Referring to FIG. 4, in the embodiment, the display device 1000 may be a foldable display device. The display device 1000 may be folded outwardly or inwardly based on the folding axis FAX. When the display device 1000 is folded outwardly based on the folding axis FAX, display surfaces thereof are each positioned at outer sides in the third direction DR3, so that images may be displayed in both directions. When the light emitting display device 1000 is folded inwardly based on the folding axis FAX, the display surfaces thereof may not be viewed from the outside.

In the embodiment, the display device 1000 may include a display area DA and a non-display area PA. The display area DA may include a first display area DA1 and a second display area DA2. The first display area DA1 may be divided into a (1-1)-th display area DA1-1, a (1-2)-th display area DA1-2, and a folding area FA. The (1-1)-th display area DA1-1 and the (1-2)-th display area DA1-2 may be disposed at the left and right sides, respectively, based on (or at the center) of the folding axis FAX, and the folding area FA may be disposed between The (1-1)-th display area DA1-1 and the (1-2)-th display area DA1-2. In this case, when folded outwardly based on the folding axis FAX, the (1-1)-th display area DA1-1 and the (1-2)-th display area DA1-2 are disposed at both sides in the third direction DR3, and an image may be displayed in both directions. In addition, when folded inwardly based on the folding axis FAX, the (1-1)-th display area DA1-1 and the (1-2)-th display area DA1-2 may not be viewed from the outside.

Figure 5:
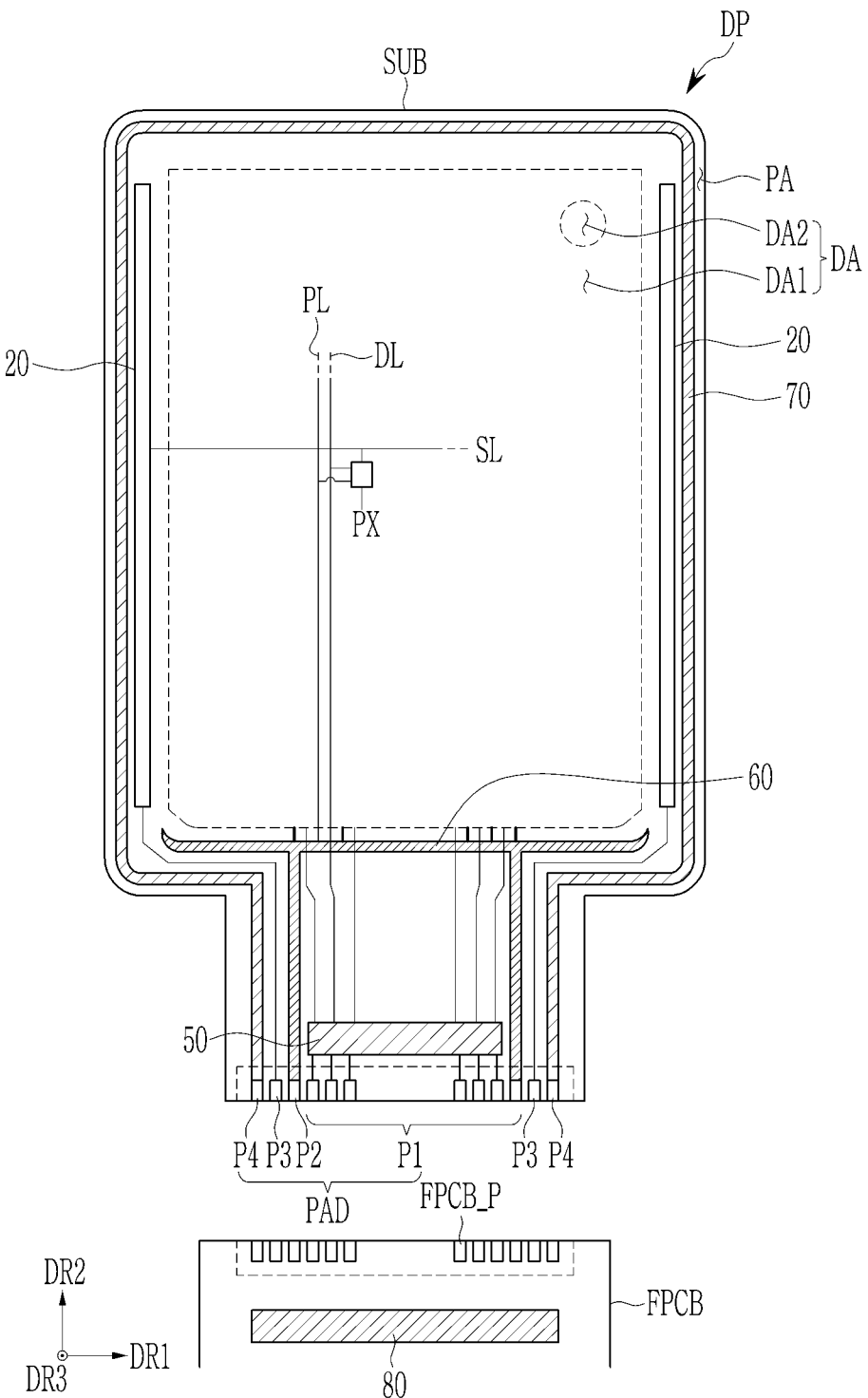
FIG. 5 illustrates a top plan view of some constituent elements of a display panel according to an embodiment.

Hereinafter, a structure of the display panel DP will be described, and first, the structure of the display panel DP will be described in detail with reference to FIG. 5. FIG. 5 illustrates a top plan view of some constituent elements of a display panel according to an embodiment.

Referring to FIG. 5, the display panel DP includes a plurality of pixels PX. The plurality of pixels PX may be disposed in the display area DA. Each of the pixels PX includes a light emitting element and a pixel circuit connected to the light emitting element. Each pixel PX emits, for example, red, green, blue, or white light, and may include an organic light emitting element (organic light emitting diode) as an example.

The display panel DP may include a plurality of signal lines and a pad part. The plurality of signal lines may include a scan line SL extending in the first direction DR1, and a data line DL and a driving voltage line PL extending in the second direction DR2.

A scan driver 20 is disposed at the left and right of the display area DA, and generates and transmits a scan signal to each pixel PX through the scan line SL. The pixel PX may receive scan signals together from two scan drivers 20 disposed at the left and right sides, respectively.

A pad part PAD (hereinafter also referred to as a pad part for a circuit board) is disposed at one end of the non-display area PA of the display panel DP, and may include a plurality of terminals P1, P2, P3, and P4. The pad part PAD may be exposed without being covered by an insulation layer to be electrically connected to the flexible printed circuit board FPCB. The pad part PAD may be electrically connected to a pad part FPCB_P of the flexible printed circuit board FPCB. The flexible printed circuit board FPCB may transmit a signal or power source of an IC driving chip 80 to the pad part PAD.

The IC driving chip 80 converts a plurality of image signals transmitted from the outside into a plurality of image data signals, and transmits the converted signals to the data driver 50 through the terminal P1. In addition, the IC driving chip 80 may receive a vertical synchronization signal, a horizontal synchronization signal, and a clock signal, and generates a control signal for controlling operations of the scan driver 20 and the data driver 50 to transmit it to each of the scan driver 20 and the data driver 50 through the terminals P3 and P1. The IC driving chip 80 transmits a driving voltage ELVDD to a driving voltage supply wire 60 through the terminal P2. In addition, the IC driving chip 80 may transmit a common voltage ELVSS to each common voltage supply wire 70 through the terminal P4.

The data driver 50 is disposed on the non-display area PA, and generates a data voltage DATA to be applied to each pixel PX to transmit it to each data line DL. The data driver 50 may be disposed at one side of the display panel DP, and for example, may be disposed between the pad part PAD and the display area DA. Referring to FIG. 5, the data line DL connected to the remaining pixels PX except for the pixels PX disposed above and below the second display area DA2 along the second direction DR2 may extend along the second direction DR2 and may have a straight structure. In contrast, the data line DL connected to the pixel PX positioned above and below the second display area DA2 extends along the second direction DR2, but in a periphery of the second display area DA2, a portion extending along the periphery of the display area DA2 may be included.

The driving voltage supply wire 60 is disposed on the non-display area PA. For example, the driving voltage supply wire 60 may be disposed between the data driver 50 and the display area DA. The driving voltage supply wire 60 provides the driving voltage ELVDD to the pixels PX. The driving voltage supply wire 60 may be disposed in the first direction DR1, and may be connected to a plurality of driving voltage lines PL disposed in the second direction DR2.

The common voltage supply wire 70 is disposed on the non-display area PA. The common voltage supply wire 70 may have a shape surrounding a substrate SUB. The common voltage supply wire 70 transmits the common voltage ELVSS to one electrode (for example, a cathode) of the light emitting element included in the pixel PX.

Figure 6:
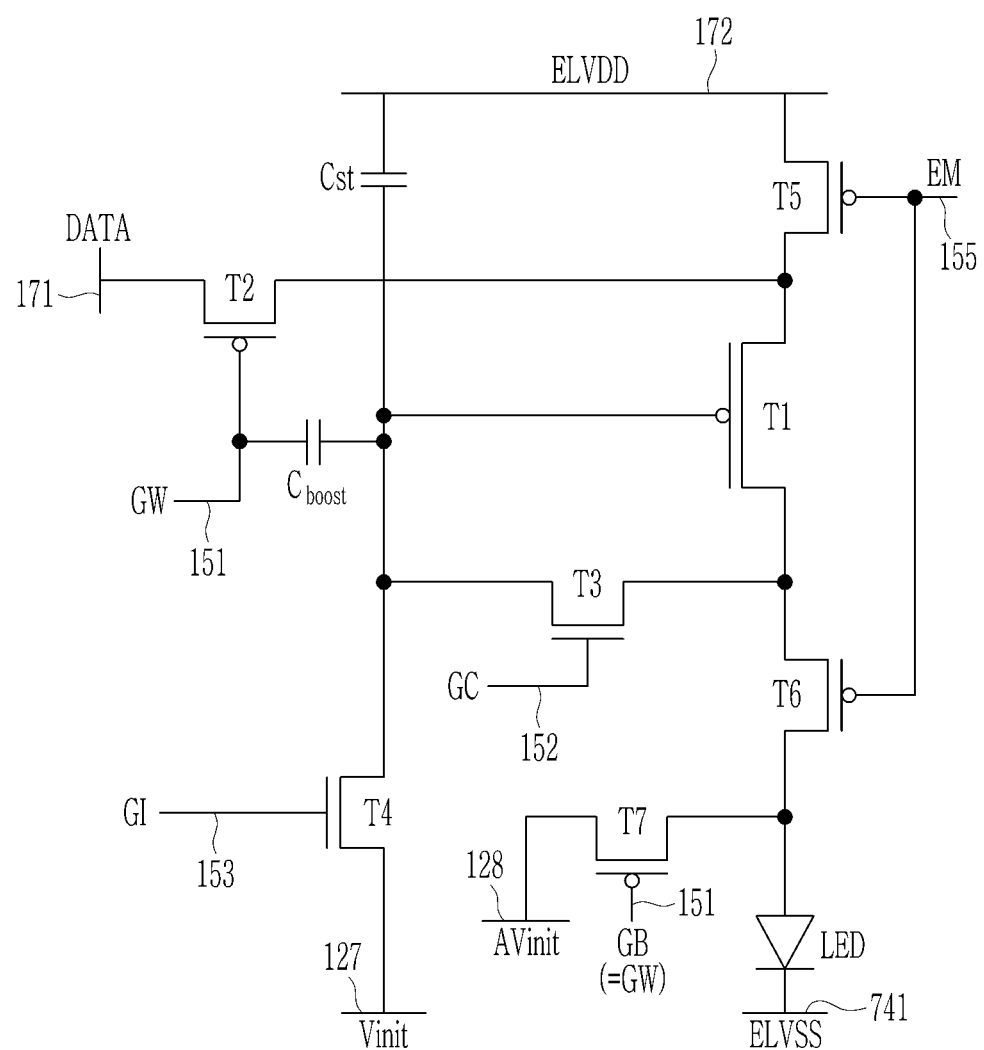
FIG. 6 illustrates a circuit diagram of one pixel included in a display panel according to an embodiment.

An example of a circuit structure of the pixel PX disposed on the display panel DP as described above will be described with reference to FIG. 6. FIG. 6 illustrates a circuit diagram of one pixel included in a display panel according to an embodiment.

The circuit structure shown in FIG. 6 is a circuit structure of a pixel circuit part and a light emitting element formed in the first display area DA1 and the second display area DA2.

One pixel according to the embodiment includes transistors T1, T2, T3, T4, T5, T6, and T7, a storage capacitor Cst, a boost capacitor Cboost, and a light emitting element ED connected to a plurality of wires 127, 128, 151, 152, 153, 155, 171, 172, and 741. Here, the transistors and the capacitors excluding the light emitting element ED form a pixel circuit part. In some embodiments, the boost capacitor Cboost may be omitted.

Figure 7:
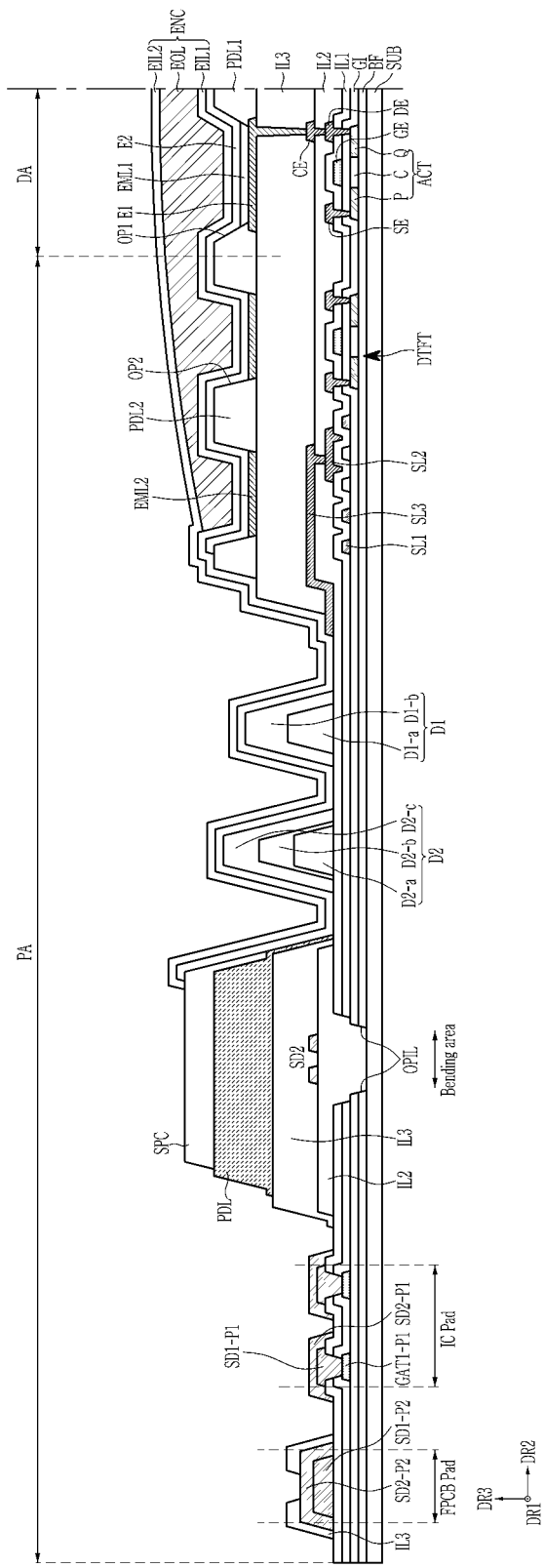
FIG. 7 illustrates a cross-sectional view of portions of a display area and a non-display area.

The plurality of wires 127, 128, 151, 152, 153, 155, 171, 172, and 741 are connected to one pixel PX. The plurality of wires include a first initialization voltage line 127, a second initialization voltage line 128, a first scan line 151, a second scan line 152, an initialization control line 153, an emission control line 155, a data line 171, a driving voltage line 172, and a common voltage line 741. In the embodiment of FIG. 7, the first scan line 151 connected to the seventh transistor T7 is also connected to the second transistor T2, but in some embodiments, the seventh transistor T7, unlike the second transistor T2, may be connected to a bypass control line.

The first scan line 151 is connected to a scan driver to transmit a first scan signal GW to the second transistor T2 and the seventh transistor T7. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The emission control line 155 transmits an emission control signal EM to the fifth transistor T5 and the sixth transistor T6.

The data line 171 is a line that transmits a data voltage DATA generated by a data driver, and thus, as an amount of a current transmitted to the light emitting element ED is changed, luminance emitted by the light emitting element ED is also changed. The driving voltage line 172 applies a driving voltage ELVDD. The first initialization voltage line 127 transmits a first initialization voltage Vinit, and the second initialization voltage line 128 transmits a second initialization voltage A Vinit. The common voltage line 741 applies a common voltage ELVSS to a cathode of the light emitting element LED. In the embodiment described herein, each of voltages applied to the driving voltage line 172, the first and second initialization voltage lines 127 and 128, and the common voltage line 741 may be a constant voltage.

The driving transistor T1 (also referred to as the first transistor) is a p-type transistor, and has a silicon semiconductor as a semiconductor layer. It is a transistor that adjusts the amount of emission current outputted to the anode of the light emitting element LED according to a voltage (that is, a voltage stored in the storage capacitor Cst) of a gate electrode of the driving transistor T1. Since brightness of the light emitting element LED is adjusted according to an amount of an emission current outputted to the anode electrode of the light emitting element LED, light emission luminance of the light emitting element LED may be adjusted according to the data voltage DATA applied to the pixel. For this purpose, a first electrode of the driving transistor T1 is disposed to receive the driving voltage ELVDD, and is connected to the driving voltage line 172 via the fifth transistor T5. In addition, the first electrode of the driving transistor T1 is connected to a second electrode of the second transistor T2 to receive the data voltage DATA. A second electrode of the driving transistor T1 outputs the emission current to the light emitting element LED, and is connected to the anode of the light emitting element LED via the sixth transistor T6 (hereinafter referred to as an output control transistor). In addition, the second electrode of the driving transistor T1 is also connected to the third transistor T3 to transmit the data voltage DATA applied to the first electrode thereof to the third transistor T3. A gate electrode of the driving transistor T1 is connected to one electrode of the storage capacitor Cst (hereinafter referred to as a 'second storage electrode'). Accordingly, a voltage of the gate electrode of the driving transistor T1 is changed according to a voltage stored in the storage capacitor Cst, and accordingly, an emission current outputted from the driving transistor T1 is changed. The storage capacitor Cst serves to maintain the voltage of the gate electrode of the driving transistor T1 constant for one frame. The gate electrode of the driving transistor T1 may also be connected to the third transistor T3 so that the data voltage DATA applied to the first electrode of the driving transistor T1 passes through the third transistor T3 to be transmitted to the gate electrode of the driving transistor T1. The gate electrode of the driving transistor T1 may also be connected to the fourth transistor T4 to be initialized by receiving the first initialization voltage Vinit.

The second transistor T2 is a p-type transistor, and has a silicon semiconductor as a semiconductor layer. The second transistor T2 is a transistor that allows the data voltage DATA to be received into the pixel. A gate electrode of the second transistor T2 is connected to the first scan line 151 and one electrode of the boost capacitor Cboost (hereinafter referred to as a 'lower boost electrode'). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1, and finally, the data voltage DATA is transmitted to the gate electrode of the driving transistor T1 to be stored in the storage capacitor Cst.

The third transistor T3 is an n-type transistor, and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by a threshold voltage of the driving transistor T1 and then stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor Cboost (hereinafter referred to as an 'upper boost electrode'). The third transistor T3 is turned on by a positive voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is an n-type transistor, and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

The fifth transistor T5 and the sixth transistor T6 are p-type transistors, and have silicon semiconductors as a semiconductor layer.

The fifth transistor T5 serves to transmit the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 serves to transmit an emission current outputted from the driving transistor T1 to the light emitting element LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting element LED.

The seventh transistor T7 is a p-type or n-type transistor, and has a silicon semiconductor or oxide semiconductor as a semiconductor layer. The seventh transistor T7 serves to initialize the anode of the light emitting element LED. A gate electrode of the seventh transistor T7 is connected to the first scan line 151, a first electrode of the seventh transistor T7 is connected to the anode of the light emitting element LED, and a second electrode of the seventh transistor T7 is connected to the second initialization voltage line 128. When the seventh transistor T7 is turned on by a negative voltage of the first scan line 151, the second initialization voltage A Vint is applied to the anode of the light emitting element LED to initialize it. The gate electrode of the seventh transistor T7 may be connected to a separate bypass control line, and may separately control it from the first scan line 151. In addition, in some embodiments, the second initialization voltage line 128 to which the second initialization voltage A Vinit is applied may be the same as the first initialization voltage line 127 to which the first initialization voltage Vinit is applied.

It is described that one pixel PX includes the seven transistors T1 to T7 and two capacitors (the storage capacitor Cst and the boost capacitor $C_{boost}$), but the embodiments described herein are not limited thereto, and in some embodiments, the boost capacitor $C_{boost}$ may be removed. In addition, although the third transistor and the fourth transistor are formed as n-type transistors, only one of them may be formed as an n-type transistor or the other thereof may be formed as an n-type transistor. In addition, as another embodiment, all of the seven transistors may be changed to p-type transistors or n-type transistors.

Hereinafter, a stacked structure of a display panel according to an embodiment will be described with reference to FIG. 7. FIG. 7 illustrates a cross-sectional view of portions of a display area and a non-display area.

The display panel according to the embodiment may include the display area DA and the non-display area PA. Hereinafter, the display area DA will be first described, and then the non-display area PA will be described.

The display panel DP includes the substrate SUB. The substrate SUB may include an inorganic insulating material such as glass or an organic insulating material such as plastic such as polyimide (PI). The substrate SUB may be single-layered or multi-layered. The substrate SUB may have a structure in which at least one base layer and at least one inorganic layer, which include polymer resins sequentially stacked, are alternately stacked.

The substrate SUB may have various degrees of flexibility. The substrate SUB may be a rigid substrate, or a flexible substrate that is bendable, foldable, or rollable.

A buffer layer BF may be disposed on the substrate SUB. The buffer layer BF blocks impurities from being transmitted from the substrate SUB to an upper layer of the buffer layer BF, particularly a semiconductor layer ACT, thereby preventing characteristic degradation of the semiconductor layer ACT and reducing stress. The buffer layer BF may include an inorganic insulating material such as a silicon nitride, a silicon oxynitride, or a silicon oxide, or an organic insulating material. A portion or all of the buffer layer BF may be omitted.

The semiconductor layer ACT is disposed on the buffer layer BF. The semiconductor layer ACT may include at least one of polycrystalline silicon and an oxide semiconductor. The semiconductor layer ACT includes a channel area (C), a first area (P), and a second area (Q). The first area (P) and the second area (Q) are disposed at respective sides of the channel area (C). The channel area (C) may include a semiconductor with a small amount of impurity doped or a semiconductor with no impurity doped, and the first area (P) and the second area (Q) may include semiconductors with a large amount of impurity doped compared to the channel area (C). The semiconductor layer ACT may be formed of an oxide semiconductor, and in this case, a separate passivation layer may be added to protect an oxide semiconductor material that is vulnerable to external environments such as a high temperature.

A gate insulating layer GI is disposed on the semiconductor layer ACT. The gate insulating layer GI may be a single layer or multilayer including at least one of a silicon oxide ($SiO_x$), a silicon nitride ($SiN_x$), and a silicon oxynitride ($SiO_xN_y$).

A gate electrode GE is disposed on the gate insulating layer GI. The gate electrode GE may be a single layer or multilayer in which metal films containing one of copper (Cu), a copper alloy, aluminum (Al), an aluminum alloy, molybdenum (Mo), a molybdenum alloy, titanium (Ti), and a titanium alloy are stacked. The gate electrode GE may overlap the channel area (C) of the semiconductor layer ACT.

A first insulating layer IL1 is disposed on the gate electrode GE and the gate insulating layer GI. The first insulating layer IL1 may be a single layer or multilayer including at least one of a silicon oxide ($SiO_x$), a silicon nitride ($SiN_x$), and a silicon oxynitride ($SiO_xN_y$).

A source electrode SE and a drain electrode DE are disposed on the first insulating layer IL1. The source electrode SE and the drain electrode DE are connected to the first area (P) and the second area (Q) of the semiconductor layer ACT through a contact hole formed in the first insulating layer IL1, respectively.

The source electrode SE and the drain electrode DE may include aluminum (Al), silver (Ag), magnesium (Mg), gold (Au), nickel (Ni), chromium (Cr), calcium (Ca), molybdenum (Mo), titanium (T1), tungsten (W), and/or copper (Cu), and may have a single-layered or multi-layered structure including them.

A second insulating layer IL2 is disposed on the first insulating layer IL, the source electrode SE, and the drain electrode DE. The second insulating layer IL2 may include an organic insulating material such as a general purpose polymer such as polymethyl methacrylate (PMMA) or polystyrene (PS), a polymer derivative having a phenolic group, a acryl-based polymer, an imide-based polymer, a polyimide, an acryl-based polymer, and a siloxane-based polymer. The second insulating layer IL2 formed as a single layer is illustrated herein, but the embodiments described herein are not limited thereto, and it may be formed as a multilayer.

A connecting electrode CE is disposed on the second insulating layer IL2. The connecting electrode CE may be electrically connected to the drain electrode DE through a contact hole formed in the second insulating layer IL2.

A third insulating layer IL3 may be disposed on the second insulating layer IL2 and the connecting electrode CE. The third insulating layer IL3 may include an organic insulating material such as a general purpose polymer such as polymethyl methacrylate (PMMA) or polystyrene (PS), a polymer derivative having a phenolic group, a acryl-based polymer, an imide-based polymer, a polyimide, an acryl-based polymer, and a siloxane-based polymer. The third insulating layer IL3 formed as a single layer is illustrated herein, but the embodiments described herein are not limited thereto, and it may be formed as a multilayer.

A first electrode E1 is disposed on the third insulating layer IL3. The first electrode E1 is electrically connected to the drain electrode DE through a contact hole with which the insulating layer is provided.

The first electrode E1 may contain a metal such as silver (Ag), lithium (Li), calcium (Ca), aluminum (Al), magnesium (Mg), or gold (Au), and may also contain a transparent conductive oxide (TCO) such as an indium tin oxide (ITO) or an indium zinc oxide (IZO). The first electrode E1 may be formed of a single layer including a metal material or a transparent conductive oxide, or a multilayer including them. For example, the first electrode E1 may have a triple-layered structure of indium tin oxide (JTO)/silver (Ag)/indium tin oxide (ITO).

A transistor configured of the gate electrode GE, the semiconductor layer ACT, the source electrode SE, and the drain electrode DE that are disposed in the display area DA is connected to the first electrode E1 to supply a current to a light emitting device.

A first pixel defining layer PDL1 is disposed on the third insulating layer IL3 and the first electrode E1.

The first pixel defining layer PDL1 overlaps at least a portion of the first electrode E1, and has a first opening OP1 defining a light emitting area. The first opening OP1 may have a planar shape that is substantially similar to that of the first electrode E1. The first opening OP1 may have various shapes such as a rhombus shape or an octagonal shape similar to a rhombus shape, a quadrangular shape, a polygonal shape, a circular shape, and an elliptical shape.

The first pixel defining layer PDL1 may include an organic insulating material. Alternatively, the first pixel defining layer PDL1 may include an inorganic insulating material such as a silicon nitride, a silicon oxynitride, or a silicon oxide. Alternatively, the first pixel defining layer PDL1 may include an organic insulating material and an inorganic insulating material. In the embodiment, the first pixel defining layer PDL1 includes alight blocking material, and may be provided in black. The light blocking material may include carbon black, carbon nanotubes, a resin or paste containing a black dye, metal particles such as nickel, aluminum, molybdenum, and an alloy thereof, metal oxide particles (for example, chromium oxide), or metal nitride particles (for example, chromium nitride). When the first pixel defining layer PDL1 includes a light blocking material, it is possible to reduce reflection of external light by metal structures disposed under the first pixel defining layer PDL1. However, the embodiments described herein are not limited thereto. In another embodiment, the first pixel defining layer PDL1 may include a light transmitting organic insulating material without including a light blocking material.

A spacer may be disposed on the first pixel defining layer PDL1. The spacer may include an organic insulating material such as a polyimide. Alternatively, the spacer may include an inorganic insulating material such as a silicon nitride ($SiN_x$) or a silicon oxide ($SiO_2$), or may include an organic insulating material and an inorganic insulating material.

A first emission layer EML1 is disposed on the first electrode E1. The first emission layer EML1 may include an organic material and/or an inorganic material. The first emission layer EML1 may generate a predetermined colored light. The first emission layer EML1 may be formed to be disposed only within the first opening OP1 of the first pixel defining layer PDL1 by using a mask or an inkjet process.

A first functional layer may be disposed between the first emission layer EML1 and the first electrode E1, and a second functional layer may be disposed between the first emission layer EML1 and a second electrode E2. The first functional layer may include at least one of a hole injection layer (HIL) and a hole transporting layer (HTL), and the second functional layer may include at least one of an electron transporting layer (ETL) and an electron injection layer (EIL).

The first emission layer EML1 is disposed in each pixel to correspond to the first opening OP1 of the first pixel defining layer PDL1, whereas the first functional layer and the second functional layer may be integrally formed to entirely cover the substrate SUB, respectively.

The second electrode E2 is disposed on the first emission layer EML1. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), or molybdenum (Mo) or a transparent conductive oxide (TCO) such as an indium tin oxide (ITO) or an indium zinc oxide (IZO).

The first electrode E1, the first emission layer EML1, and the second electrode E2 may form a light emitting element. Here, the first electrode E1 may be an anode, which is a hole injection electrode, and the second electrode E2 may be a cathode, which is an electron injection electrode. However, the embodiment is not necessarily limited thereto, and the first electrode E1 may be a cathode and the second electrode E2 may be an anode, according to a driving method of the light emitting display device.

Holes and electrons are injected into the first emission layer EML from the first electrode E1 and second electrode E2, respectively, and light is emitted when excitons in which the injected holes and electrons are combined enter a ground state from an excited state.

An encapsulation layer ENC is disposed on the second electrode E2. The encapsulation layer ENC may cover and seal not only an upper surface but also a side surface of the light emitting element. Since the light emitting element is very vulnerable to moisture and oxygen, the encapsulation layer ENC seals the light emitting element to block inflow of moisture and oxygen from the outside.

The encapsulation layer ENC may include a plurality of layers, and in this case, it may be formed as a composite film including both an inorganic layer and an organic layer, and for example, it may be formed as a triple layer in which a first encapsulation inorganic layer EIL1, an encapsulation organic layer EOL, and a second encapsulation inorganic layer EIL2 are sequentially formed.

The first encapsulation inorganic layer EIL1 may cover the second electrode E2. The first encapsulation inorganic layer EIL1 may prevent external moisture or oxygen from penetrating into the light emitting device. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be disposed on the first encapsulation inorganic layer EIL1 to contact the first encapsulation inorganic layer EILL. Curved portions formed on an upper surface of the first encapsulation inorganic layer EIL1 or particles of being present on the first encapsulation inorganic layer EIL1 are covered by the encapsulation organic layer EOL, so that influence on constituent elements formed on the encapsulation organic layer EOL by the surface state of the upper surface of the first encapsulation inorganic layer EIL1 may be blocked. In addition, the encapsulation organic layer EOL may reduce stress between layers in contact with each other. The encapsulation organic layer EOL may include an organic material forming the encapsulation organic layer, and may be formed through a solution process such as a spin coating, slit coating, or inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flat surface compared to the first encapsulation inorganic layer EIL1. The second encapsulation inorganic layer EIL2 encapsulates moisture discharged from the encapsulation organic layer EOL to prevent outflow to the outside. The second encapsulation inorganic layer EIL2 may include a silicon nitride, a silicon oxide, a silicon oxynitride, or a combination thereof. The second encapsulation inorganic layer EIL2 may be formed through a deposition process.

Hereinafter, the non-display area PA will be described. A description of the same configuration as that of the display area DA will be omitted for ease in explanation of the embodiment.

The buffer layer BF extending from the display area DA and a dummy transistor DTFT disposed on the buffer layer BF may be disposed in the non-display area PA. The dummy transistor DTFT may not be electrically connected to a second emission layer EML2 disposed in the non-display area PA. In addition, a plurality of signal lines SL1, SL2, and SL3 may be disposed in the non-display area PA. The plurality of signal lines SL1, SL2, and SL3 may be positioned on the same layer as the gate electrode GE, positioned on the same layer as the source electrode SE and the drain electrode DE, or positioned on the same layer as the connecting electrode CE. The plurality of signal lines SL1, SL2, and SL3 are not limited to the shapes shown herein, and may be modified in various shapes.

The gate insulating layer GI, the first insulating layer IL1, the second insulating layer IL2, and the third insulating layer IL3 extending from the display area DA may be disposed in the non-display area PA. The gate insulating layer GI, the first insulating layer IL1, the second insulating layer IL2, and the third insulating layer IL3 may be removed in a partial region.

A second pixel defining layer PDL2 may be disposed on the third insulating layer IL3 disposed in the non-display area PA. The second pixel defining layer PDL2 may include a second opening OP2. The second opening OP2 may expose the second emission layer EML2. The second opening OP2 may have various shapes such as a rhombus shape or an octagonal shape similar to a rhombus shape, a quadrangular shape, a polygonal shape, a circular shape, and an elliptical shape, in a plan view.

A second emission layer EML2 may be disposed in the second opening OP2 of the second pixel defining layer PDL2 disposed in the non-display area PA. The second emission layer EML2 may include an organic material and/or an inorganic material. The second emission layer EM1L2 may generate a predetermined colored light. The second emission layer EM1L2 may be formed to be disposed only within the second opening OP of the second pixel defining layer PDL2 by using a mask or an inkjet process. The second electrode E2 extending from the display area DA may be disposed on the second emission layer EML2. The second emission layer EM1L2 disposed in the non-display area PA may be a dummy emission layer to which a separate voltage is not applied.

The first encapsulation inorganic layer EIL1 extending from the display area DA may be disposed on the second electrode E2. The encapsulation organic layer EOL extending from the display area DA may be disposed on the first encapsulation inorganic layer EIL1. The second encapsulation inorganic layer EIL2 extending from the display area DA may be disposed on the encapsulation organic layer EOL.

According to the embodiment, an end of the encapsulation organic layer EOL overlapping the non-display area PA may overlap the second pixel defining layer PDL2. In a manufacturing process, an organic material for forming the encapsulation organic layer EOL is formed in the second opening OP2 of the second pixel defining layer PDL2, so that the end of the encapsulation organic layer EOL may overlap the second pixel defining layer PDL2. The organic material for forming the encapsulation organic layer may be prevented from overflowing by the second pixel defining layer PDL2. The encapsulation organic layer EOL may have a shape that fills a step formed by the second pixel defining layer PDL2. According to this structure, it is possible to reduce an area of the non-display area PA, and since the encapsulation organic layer EOL is stably formed, it is possible to provide a display device with improved reliability.

A plurality of dams D1 and D2 may be disposed in the non-display area PA. Two dams are shown herein, and the number and shape thereof are not limited. The plurality of dams D1 and D2 are formed on a plurality of inorganic layers (the buffer layer BF, the gate insulating layer GI, and the first insulating layer IL1) extending from display area DA.

The first dam D1 may be positioned closer to the display area DA than the second dam D2, and the first dam D1 may have a lower height than the second dam D2.

The first dam D1 may include a (1-1)-th sub-dam (D1-*a*) and a (1-2)-th sub-dam (D1-*b*). The second dam D2 may include a (2-1)-th sub-dam (D2-*a*), a (2-2)-th sub-dam (D2-*b*), and a (2-3)-th sub-dam (D2-*c*). The first dam D1 and the second dam D2 may include the same material as the organic layers disposed in the display area DA, and may be formed in the same process.

The first encapsulation inorganic layer EIL1 extending from the display area DA is disposed on each of the dams D1 and D2. The second encapsulation inorganic layer EIL2 overlapping the front surface of the substrate SUB may be disposed on the first encapsulation inorganic layer EIL1. The first encapsulation inorganic layer EIL1 has a structure in contact with the second encapsulating inorganic layer EIL2 on the dams D1 and D2. The first encapsulation inorganic layer EIL1 blocks moisture and oxygen from the outside through a structure in contact with the second encapsulation inorganic layer EIL2.

The encapsulation organic layer EOL according to the embodiment is formed to overlap the second pixel defining layer PDL2 forming a dummy area, and may not overlap the dams D1 and D2 according to the embodiment. The dams D1 and D2 may be spaced apart from the encapsulation organic layer EOL. The dams D1 and D2 may prevent overflowing of the organic material forming the encapsulation organic layer EOL during the manufacturing process, but according to the embodiments described herein, since overflowing of the organic material may be prevented by the second pixel defining layer PDL2, the dams D1 and D2 may not overlap the encapsulation organic layer EOL.

A driver pad part (IC Pad) is illustrated as having a triple-layered structure. The driver pad part (IC Pad) may include a gate additional pad electrode GAT1-P1 formed of a gate conductive layer, a (1-1)-th data additional pad electrode SD1-P1 formed in the same process as the source electrode SE, and a (1-2)-th data additional pad electrode SD2-P1 formed in the same process as the connecting electrode CE. In some embodiments, one of the above-described additional pad electrodes of the driver pad part (IC pad) may be omitted.

A circuit board pad part (FPCB Pad) is illustrated as having a double-layered structure. The circuit board pad part (FPCB Pad) may include a (2-1)-th additional pad electrode (SD1-P2) formed in the same process as the source electrode SE, and a (2-2)-th additional pad electrode (SD2-P2) formed in the same process as the connecting electrode CE.

A bending area may be positioned between the plurality of dams D1 and D2 and the driver part (IC pad). An opening OPIL is formed in a plurality of inorganic films to correspond to the bending area. An inorganic film is not included in the bending area.

The opening OPIL formed in the bending area may be filled by the second insulating layer IL2. A plurality of organic layers formed in the same process as the third insulating layer IL3, the pixel defining layer PDL, and the spacer SPC may be stacked on the second insulating layer IL2.

Although the encapsulation layer ENC is disposed in the display area DA, since the bending area is positioned more outside than the encapsulation layer ENC, the encapsulation layer ENC is not disposed in the bending area.

Figure 8:
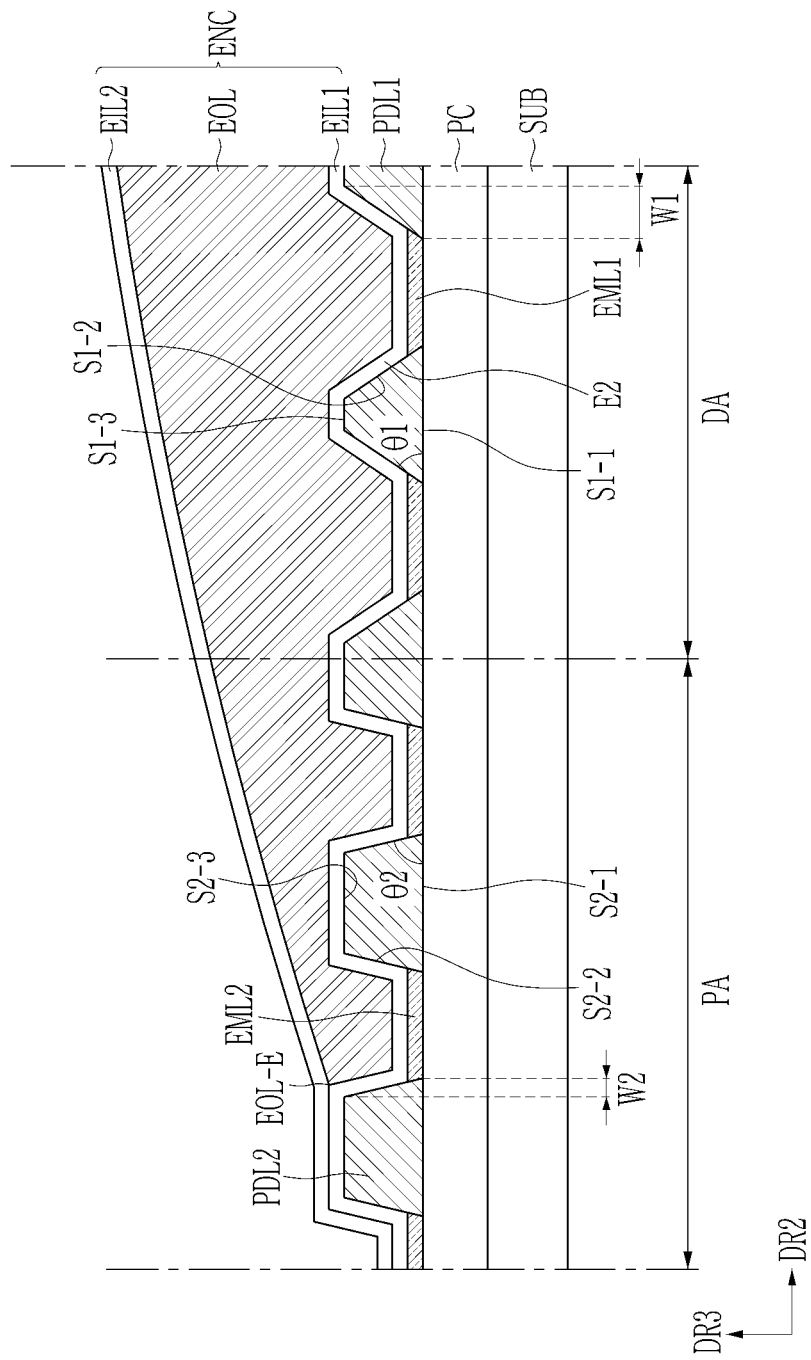
FIG. 8 illustrates a cross-sectional view of some constituent elements included in a display panel.

Hereinafter, a pixel defining layer of a display device according to an embodiment and an encapsulation layer disposed thereon will be described in detail with reference to FIG. 8. FIG. 8 illustrates a cross-sectional view of some constituent elements included in a display panel. A detailed description of the same constituent element as the above-described constituent element will be omitted for ease in explanation of this figure.

Referring to FIG. 8, a stacked structure between the substrate SUB and the first pixel defining layer PDL1 and between the substrate SUB and the second pixel defining layer PDL2 according to an embodiment is shown as a circuit part PC. Since a specific structure of the circuit part PC is shown in FIG. 7, and hereinafter, the shapes of the first pixel defining layer PDL1 and the second pixel defining layer PDL2 will be described.

The first pixel defining layer PDL1 may include a first lower surface S1-1, a first side surface S1-2, and a first upper surface S1-3. The second pixel defining layer PDL2 may include a second lower surface S2-1, a second side surface S2-2, and a second upper surface S2-3.

The first lower surface S1-1 and the first side S1-2 of the first pixel defining layer PDL1 may form a first angle θ1. The second lower surface S2-1 and the second side surface S2-2 of the second pixel defining layer PDL2 may form a second angle θ2. In this case, the first angle θ1 and the second angle θ2 may be different. The first angle θ1 may be smaller than the second angle θ2. For example, the first angle θ1 may be about 25 degrees to about 30 degrees, and the second angle θ2 may be about 45 degrees to about 50 degrees. That is, a slope of one side surface of the first pixel defining layer PDL1 with respect to an upper surface of the substrate SUB may be smaller than a slope of one side surface of the second pixel defining layer PDL2 with respect to the upper surface of the substrate SUB. The second pixel defining layer PDL2 may have a side surface having a larger slope than that of the first pixel defining layer PDL1.

In the first pixel defining layer PDL1, a distance between an end of the first lower surface S1-1 and an end of the first upper surface S1-3 is referred to as a first distance W1, and in the second pixel defining layer PDL2, a distance between an end of the second lower surface S2-1 and an end of the second upper surface S2-3 is referred to as a second distance W2. In this case, the first distance W1 and the second distance W2 may be different. For example, the first distance W1 may be larger than the second distance W2.

In addition, a ratio between an area of the first lower surface S1-1 and an area of the first upper surface S1-3 in the first pixel defining layer PDL1 may be different from a ratio between an area of the second lower surface S2-1 and an area of the second upper surface S2-3 in the second pixel defining layer PDL2. For example, the ratio between the area of the first lower surface S1-1 and the area of the first upper surface S1-3 in the first pixel defining layer PDL1 may be smaller than the ratio between the area of the second lower surface S2-1 and the area of the second upper surface S2-3 in the second pixel defining layer PDL2. That is, when the lower surfaces of the first pixel defining layer PDL1 and the second pixel defining layer PDL2 have the same area, the area of the upper surface S1-3 of the first pixel defining layer PDL1 may be smaller than the area of the upper surface S2-3 of the second pixel defining layer PDL2.

According to the embodiment, the shapes of the first pixel defining layer PDL1 disposed in the display area DA and the second pixel defining layer PDL2 disposed in the non-display area PA may be different from each other. Particularly, the slope of the side surface of the second pixel defining layer PDL2 may be larger than the slope of the side surface of the first pixel defining layer PDL1.

The second pixel defining layer PDL2 may be disposed outside the display area DA, for example, in the dummy area of the non-display area PA. Since the second pixel defining layer PDL2 has a larger slope than the first pixel defining layer PDL1, it is possible to effectively prevent the organic material for forming the encapsulation organic layer provided in the process of forming the encapsulation organic layer disposed on the pixel defining layer from spreading. Accordingly, an end EOL-E of the encapsulation organic layer EOL may be formed within a step formed by the second pixel defining layer PDL2.

The organic material for forming the encapsulation organic layer EOL may have increased fillability of filling the opening of the pixel defining layer due to aggregation between droplets as a capillary pressure Pc expressed by Equation 1 below increases. According to the embodiment, the fillability of the organic material formed on the first pixel defining layer PDL1 may be greater than that of the organic material formed on the second pixel defining layer PDL2. That is, since the organic material formed on the second pixel defining layer PDL2 has relatively low fillability, it is possible to prevent it from overflowing to the outside of the second pixel defining layer PDL2. In this case, in the following equation, y is surface tension, RX is a size of the opening, and RY is a height of the opening.

$$Pc = \gamma\left(\frac{1}{RX} + \frac{1}{RY}\right) \quad \text{[Equation 1]}$$

According to this embodiment, since an area occupied by the dam may be reduced, it is possible to reduce a dead space.

Figure 9:
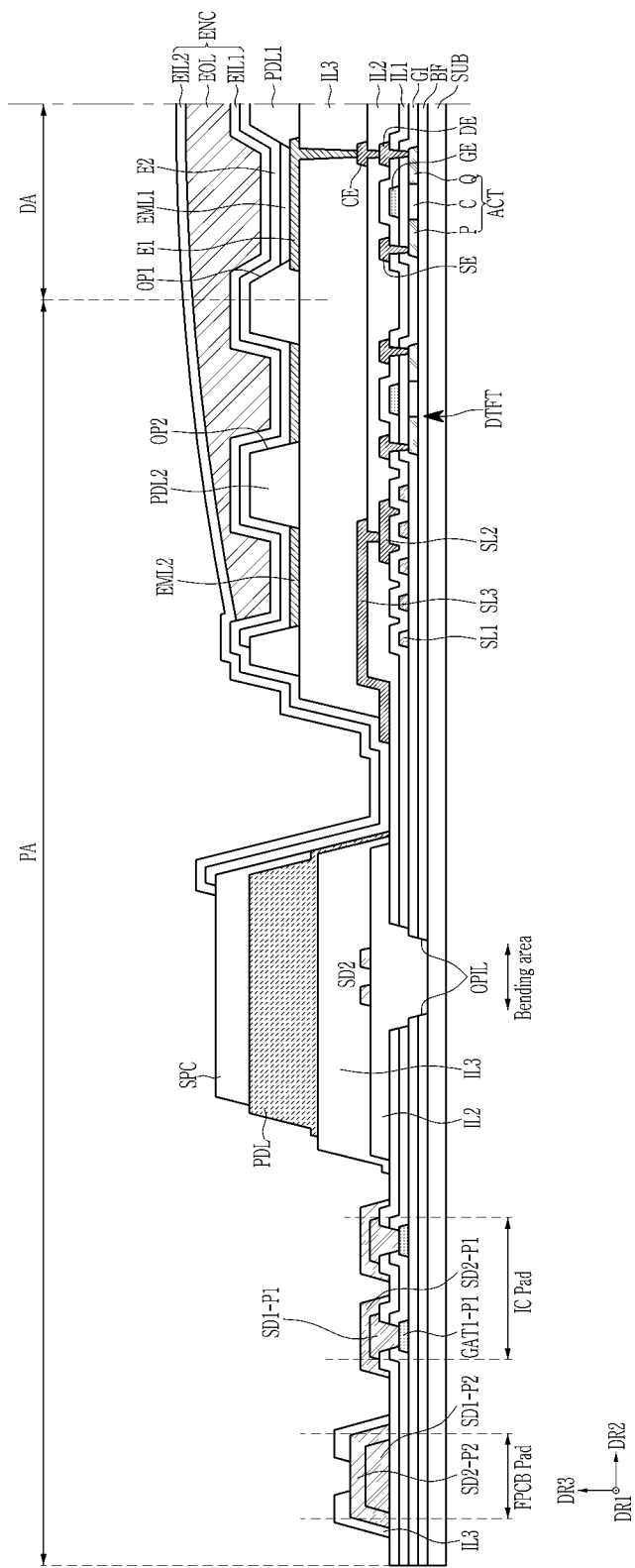
FIG. 9 illustrates a cross-sectional view of a partial area of a display panel according to an embodiment.

Hereinafter, a display device according to an embodiment will be described with reference to FIG. 9. FIG. 9 illustrates a cross-sectional view of a partial area of a display panel according to an embodiment. A description of the same constituent element as that described above will be omitted for ease in explanation of this figure.

Referring to FIG. 9, the display panel according to the embodiment may have a structure in which the dams D1 and D2 formed in the non-display area PA are removed compared with the embodiment shown in FIG. 7.

Specifically, the buffer layer BF extending from the display area DA and a dummy transistor DTFT disposed on the buffer layer BF may be disposed in the non-display area PA. The dummy transistor DTFT may not be electrically connected to a second emission layer EML2 disposed in the non-display area PA. In addition, a plurality of signal lines SL1, SL2, and SL3 may be disposed in the non-display area PA.

A second pixel defining layer PDL2 may be disposed on the third insulating layer IL3 disposed in the non-display area PA. According to the embodiment, an end of the encapsulation organic layer EOL overlapping the non-display area PA may overlap the second pixel defining layer PDL2. In a manufacturing process, an organic material for forming the encapsulation organic layer EOL is formed in the second opening OP2 of the second pixel defining layer PDL2, so that the end of the encapsulation organic layer EOL may overlap the second pixel defining layer PDL2. The organic material for forming the encapsulation organic layer may be prevented from overflowing by the second pixel defining layer PDL2. The encapsulation organic layer EOL may have a shape that fills a step formed by the second pixel defining layer PDL2. According to this structure, it is possible to reduce an area of the non-display area PA, and since the encapsulation organic layer EOL is stably formed, it is possible to provide a display device with improved reliability.

A bending area may be disposed outside the second pixel defining layer PDL2. An opening OPIL is formed in a plurality of inorganic films to correspond to the bending area. The opening OPIL formed in the bending area may be filled by the second insulating layer IL2. A plurality of organic layers formed in the same process as the third insulating layer IL3, the pixel defining layer PDL, and the spacer SPC may be stacked on the second insulating layer IL2.

A driver pad part (IC Pad) having a triple-layered structure and a circuit board pad part (FPCB Pad) having a double-layered structure may be disposed outside the bending area.

The non-display area PA of the display device according to the embodiment may include an area in which the dummy transistor DTFT and the second pixel defining layer PDL2 are disposed outside the display area DA, the bending area, and an area in which the pad parts (IC Pad and FPCB Pad) are disposed.

The encapsulation organic layer EOL may extend from the display area DA to an area of the non-display area PA overlapping the second pixel defining layer PDL2. The encapsulation organic layer EOL may be prevented from overflowing by the second pixel defining layer PDL2. That is, the encapsulation organic layer EOL may not be formed between the outermost sides of the signal lines SL1, SL2, and SL3 and the bending area. A separate constituent element for preventing overflowing of the organic material forming the encapsulation organic layer may be unnecessary outside the second pixel defining layer PDL2. Except for the plurality of organic layers overlapping the bending area, the plurality of organic layers may be omitted in an area between the bending area and the end of the second pixel defining layer PDL2.

That is, according to the embodiment, since the encapsulation organic layer EOL has the structure in which spreading thereof is controlled through the second pixel defining layer PDL2, the dam that is formed in the non-display area PA may be removed according to the embodiment. According to the embodiment, the area of the non-display area may be further reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate having a display area and a non-display area;
a first transistor that is disposed on the substrate and that overlaps the display area;
a first pixel defining layer disposed on the first transistor;
a first emission layer disposed in the first pixel defining layer;
a second pixel defining layer that is disposed on the substrate and that overlaps the non-display area;
a second emission layer disposed in the second pixel defining layer;
a second electrode disposed on the first emission layer and the second emission layer; and
an encapsulation organic layer disposed on the second electrode, wherein
the encapsulation organic layer overlaps the first pixel defining layer and the second pixel defining layer,
an end of the encapsulation organic layer is disposed inside the second pixel defining layer, and
a first angle between one side surface of the first pixel defining layer and an upper surface of the substrate and a second angle between one side surface of the second pixel defining layer and the upper surface of the substrate are different.

2. The display device of claim 1, wherein
the first angle is smaller than the second angle.

3. The display device of claim 1, wherein
the first angle is about 25 degrees to about 30 degrees.

4. The display device of claim 1, wherein
the second angle is about 45 degrees to about 50 degrees.

5. The display device of claim 1, wherein:
the first pixel defining layer includes a first side surface, a first lower surface, and a first upper surface; and
the second pixel defining layer includes a second side surface, a second lower surface, and a second upper surface.

6. The display device of claim 5, wherein
a first area ratio of the first upper surface to the first lower surface is different from a second area ratio of the second upper surface to the second lower surface.

7. The display device of claim 6, wherein
the first area ratio is smaller than the second area ratio.

8. The display device of claim 5, wherein
a distance between an end of the first upper surface and an end of the first lower surface is a first distance, and
a distance between an end of the second upper surface and an end of the second lower surface is a second distance.

9. The display device of claim 8, wherein
the first distance and the second distance are different.

10. The display device of claim 8, wherein
the first distance is larger than the second distance.

11. The display device of claim 1, wherein
the display device further includes a dam overlapping the non-display area, and the encapsulation organic layer is spaced apart from the dam.

12. The display device of claim 11, wherein
the display device further includes a first encapsulation inorganic layer and a second encapsulating inorganic layer that are disposed on respective surfaces of the encapsulation organic layer, respectively, and
the first encapsulating inorganic layer and the second encapsulating inorganic layer are disposed on the dam.

13. The display device of claim 1, wherein
a lowest surface of the encapsulation organic layer is above an upper surface of the second emission layer, and
the second emission layer is not electrically connected to the first transistor.

14. An electronic device comprising:
a substrate having a display area and a non-display area;
a first transistor that is disposed on the substrate and that overlaps the display area;
a first pixel defining layer disposed on the first transistor;
a first emission layer disposed in the first pixel defining layer;
a dummy transistor that is disposed on the substrate and that overlaps the non-display area;
a second pixel defining layer disposed on the dummy transistor;
a second emission layer disposed in the second pixel defining layer; and
a second electrode disposed on the first emission layer and the second emission layer,
wherein an angle between a first side surface of the first pixel defining layer and an upper surface of the substrate is smaller than an angle between a second side surface of the second pixel defining layer and the upper surface of the substrate.

15. The electronic device of claim 14, wherein
the display device further includes an encapsulation organic layer disposed on the second electrode, and
an end of the encapsulation organic layer is disposed in an opening of the second pixel defining layer.

16. The electronic device of claim 15, wherein
the display device further includes a dam disposed in the non-display area, and the encapsulation organic layer does not overlap the dam.

17. The electronic device of claim 14, wherein
the angle between the first side surface of the first pixel defining layer and the upper surface of the substrate is about 25 degrees to about 30 degrees, and
the angle between the second side surface of the second pixel defining layer and the upper surface of the substrate is about 45 degrees to about 50 degrees.

18. The electronic device of claim 14, wherein
an area ratio of a first upper surface to a first lower surface of the first pixel defining layer is smaller than an area ratio of a second upper surface to a second lower surface of the second pixel defining layer.

19. The electronic device of claim 14, wherein
a distance between an end of the first upper surface and an end of a lower surface of the first pixel defining layer is longer than a distance between an end of an upper surface and an end of a lower surface of the second pixel defining layer.

* * * * *